United States Patent
Tapily et al.

(10) Patent No.: US 10,453,681 B2
(45) Date of Patent: Oct. 22, 2019

(54) METHOD OF SELECTIVE VERTICAL GROWTH OF A DIELECTRIC MATERIAL ON A DIELECTRIC SUBSTRATE

(71) Applicant: Tokyo Electron Limited, Minato-ku, Tokyo (JP)

(72) Inventors: Kandabara N. Tapily, Mechanicville, NY (US); Takashi Matsumoto, Hosaka (JP); Yusaku Kashiwagi, Tokyo (JP); Gerrit J. Leusink, Rexford, NY (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/951,427

(22) Filed: Apr. 12, 2018

(65) Prior Publication Data

US 2018/0301335 A1    Oct. 18, 2018

Related U.S. Application Data

(60) Provisional application No. 62/484,815, filed on Apr. 12, 2017.

(51) Int. Cl.
| | |
|---|---|
| H01L 21/02 | (2006.01) |
| H01L 21/768 | (2006.01) |
| H01L 21/32 | (2006.01) |
| H01L 21/321 | (2006.01) |

(52) U.S. Cl.
CPC .... H01L 21/02639 (2013.01); H01L 21/0228 (2013.01); H01L 21/02164 (2013.01); H01L 21/02175 (2013.01); H01L 21/02216 (2013.01); H01L 21/02277 (2013.01); H01L 21/76897 (2013.01); H01L 21/32 (2013.01); H01L 21/321 (2013.01)

(58) Field of Classification Search
CPC ......... H01L 21/02639; H01L 21/02216; H01L 21/0228; H01L 21/02277; H01L 21/02164; H01L 21/02175; H01L 21/76897

See application file for complete search history.

(56) References Cited

U.S. PATENT DOCUMENTS

| | | | | |
|---|---|---|---|---|
| 2010/0003462 A1* | 1/2010 | Kamins | ................... | C30B 25/02 428/166 |
| 2017/0294339 A1* | 10/2017 | Tapily | ............... | H01L 21/02164 |

* cited by examiner

Primary Examiner — Anthony Ho

(57) ABSTRACT

Embodiments of the invention describe methods for selective vertical growth of dielectric material on a dielectric substrate. According to one embodiment, the method includes providing a planarized substrate containing a first material having a recessed feature that is filled with a second material, selectively depositing a graphene layer on the second material relative to the first material, selectively depositing a $SiO_2$ film on the first material relative to the graphene layer, and removing the graphene layer from the substrate. According to one embodiment, the first material includes a dielectric material and the second material includes a metal layer.

20 Claims, 7 Drawing Sheets

METHOD OF SELECTIVE VERTICAL GROWTH OF A DIELECTRIC MATERIAL ON A DIELECTRIC SUBSTRATE

CROSS-REFERENCE TO RELATED APPLICATIONS

This application is related to and claims priority to U.S. Provisional Patent Application Ser. No. 62/484,815, filed on Apr. 12, 2017, the entire contents of which are herein incorporated by reference.

FIELD OF THE INVENTION

This invention relates to methods for processing a substrate, and more particularly, to a method for selective vertical growth of dielectric material on a dielectric substrate.

BACKGROUND OF THE INVENTION

Metal-oxide-semiconductor (MOS) transistors, such as MOS field effect transistors (MOSFET), are commonly used in the manufacture of integrated circuits. MOS transistors include several components, such as a gate electrode, gate dielectric layer, spacers, and source and drain diffusion regions. An interlayer dielectric (ILD) is typically formed over the MOS transistor and covers the diffusion regions.

Electrical connections are made to the MOS transistor by way of contact plugs that are typically formed of a metal such as tungsten. The contact plugs may be fabricated by first patterning the ILD layer to form vias down to the diffusion regions. The patterning process is generally a photolithography process. Next, a metal is deposited in the vias to form the contact plugs. A separate contact plug is formed down to the gate electrode using the same or a similar process.

One problem that can occur during the fabrication of a contact plug is the formation of a contact-to-gate short. A contact-to-gate short is a short circuit that occurs when the contact plug is misaligned and comes into electrical contact with the gate electrode. One conventional approach to preventing contact-to-gate shorts is by controlling registration and critical dimensions (CDs). Unfortunately, for transistors with small gate pitches, severe CD control for gate and contact dimensions limit a manufacturable process window. Thus, the likelihood of a contact shorting to a gate is very high. This problem becomes more prevalent as transistor gate pitch dimensions are scaled down further because the critical dimensions become much smaller.

Self-aligned patterning needs to replace overlay-driven patterning so that cost-effective scaling can continue even after EUV introduction. Selective deposition of thin films is a key step in patterning highly scaled technology nodes.

SUMMARY OF THE INVENTION

Embodiments of the invention describe methods for selective vertical growth of dielectric material on a dielectric substrate. According to one embodiment, the method includes providing a planarized substrate containing a first material having a recessed feature that is filled with a second material, selectively depositing a graphene layer on the second material relative to the first material, selectively depositing a $SiO_2$ film on the first material relative to the graphene layer, removing the graphene layer from the substrate. The selectively depositing the $SiO_2$ film forms a second recessed feature that is aligned with the recessed feature that is filled with the second material, According to one embodiment, the first material includes a dielectric material and the second material includes a metal layer.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

DETAILED DESCRIPTION OF SEVERAL EMBODIMENTS

Figure 1:
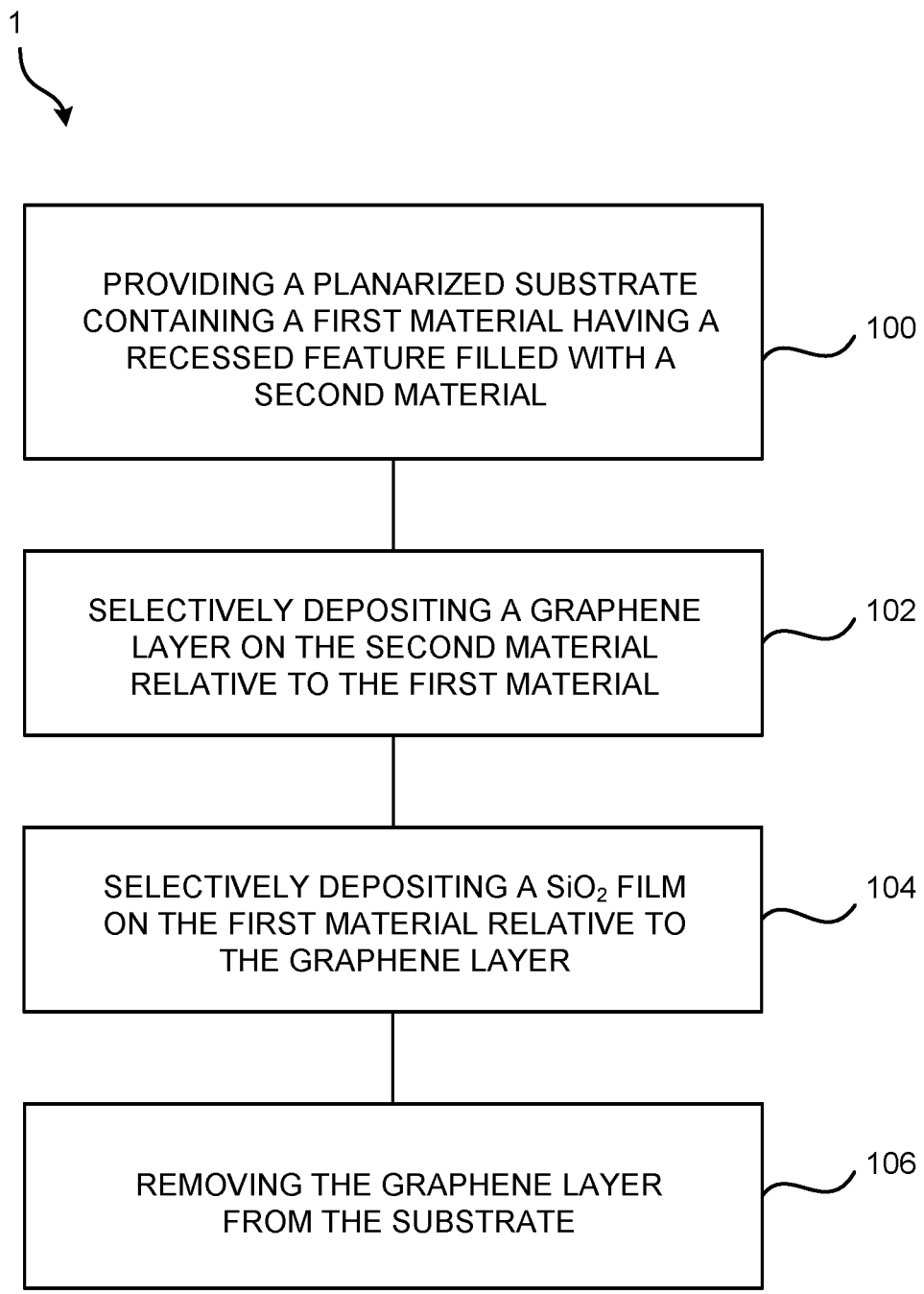
FIG. 1 is a process flow diagram for processing a substrate according to an embodiment of the invention.

FIG. 1 is a process flow diagram for processing a substrate according to an embodiment of the invention, and FIGS. 2A-2I schematically show through cross-sectional views a method of processing a substrate according to an embodiment of the invention.

Figure 2A:
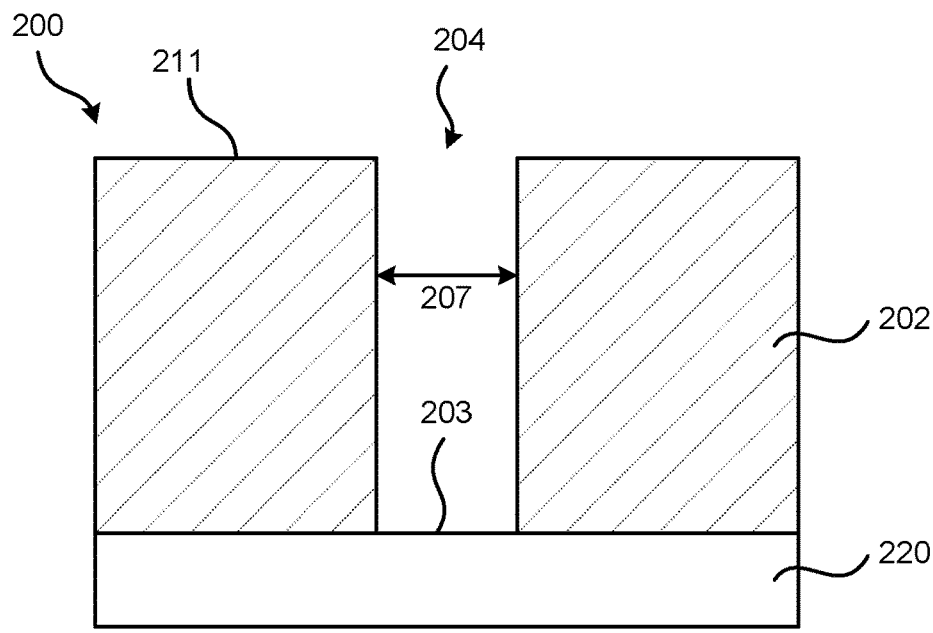
FIGS. 2A-2H schematically show through cross-sectional views a method of processing a substrate according to embodiments of the invention.

FIG. 2A shows a substrate 200 containing a first material 202 containing a recessed feature 204 and a base material 220 under the first material 202. The first material 202 has a field area 211 and the recessed feature 204 has a width 207 and a bottom portion 203. The recessed features 204 may be formed using well-known lithography and etching processes. For example, the width 207 can be less than 200 nm, less than 100 nm, less than 50 nm, less than 25 nm, less than 20 nm, or less than 10 nm. In other examples, the width 207 can be between 5 nm and 10 nm, between 10 nm and 20 nm, between 20 nm and 50 nm, between 50 nm and 100 nm, between 100 nm and 200 nm, between 10 nm and 50 nm, or between 10 nm and 100 nm.

Figure 2B:
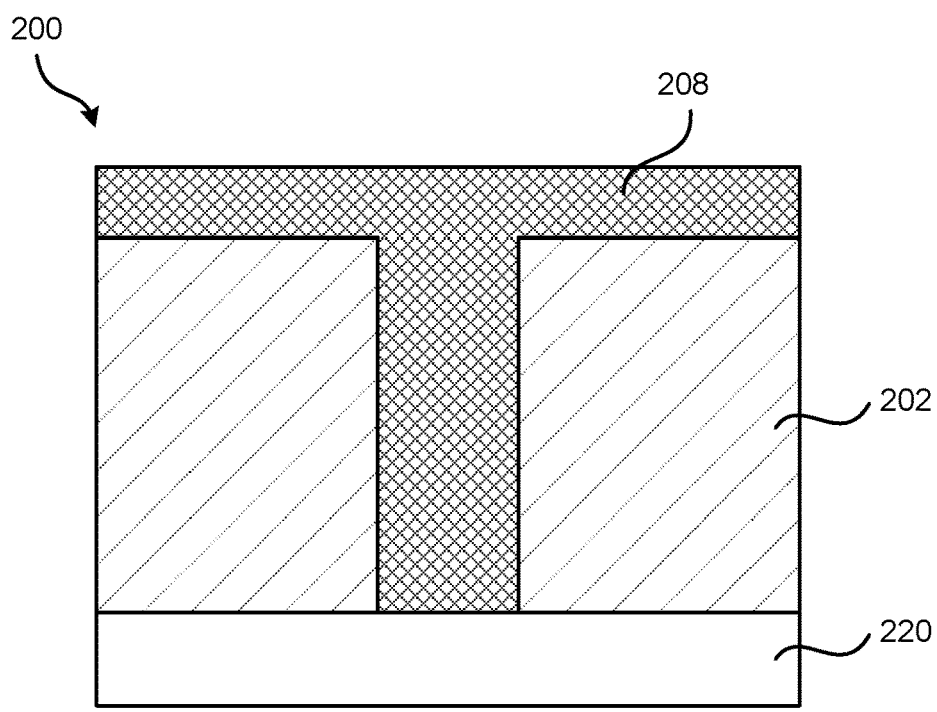
Figure 2C:
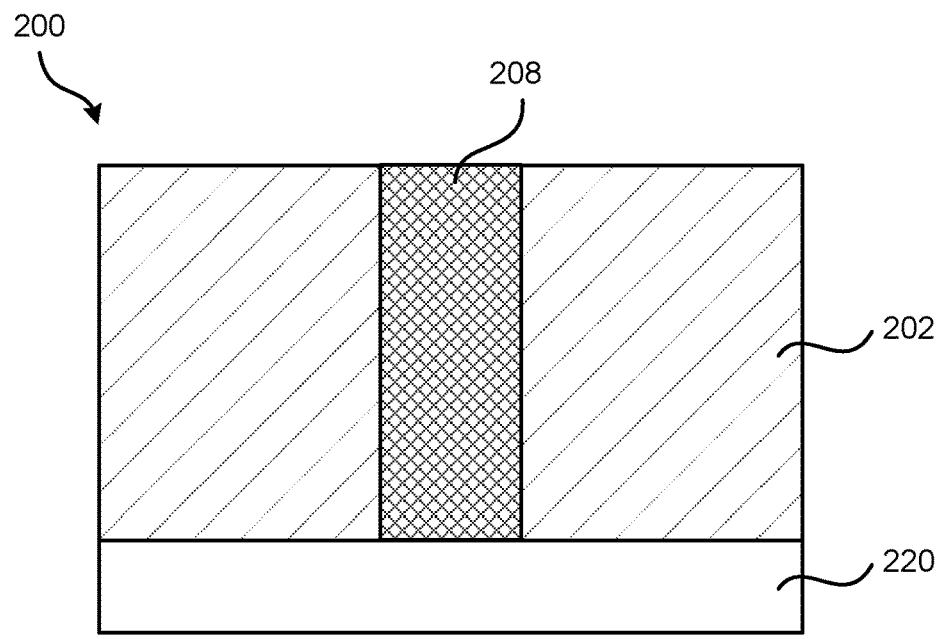

FIG. 2B shows the substrate 200 following overfilling the recessed feature 204 with a second material 208, and FIG. 2C shows the planarized substrate 200 including the first material 202 having the recessed feature 204 filled with the second material 208. According to another embodiment, the second material 208 may be selectively deposited bottom-up in the recessed feature 204. In one example, the first material 202 includes a dielectric material and the second material 208 includes at least one metal. In some examples, the first material 202 can include $SiO_2$, and the second material can include a metal layer, for example Ni, Cu, or Ru.

Figure 2D:
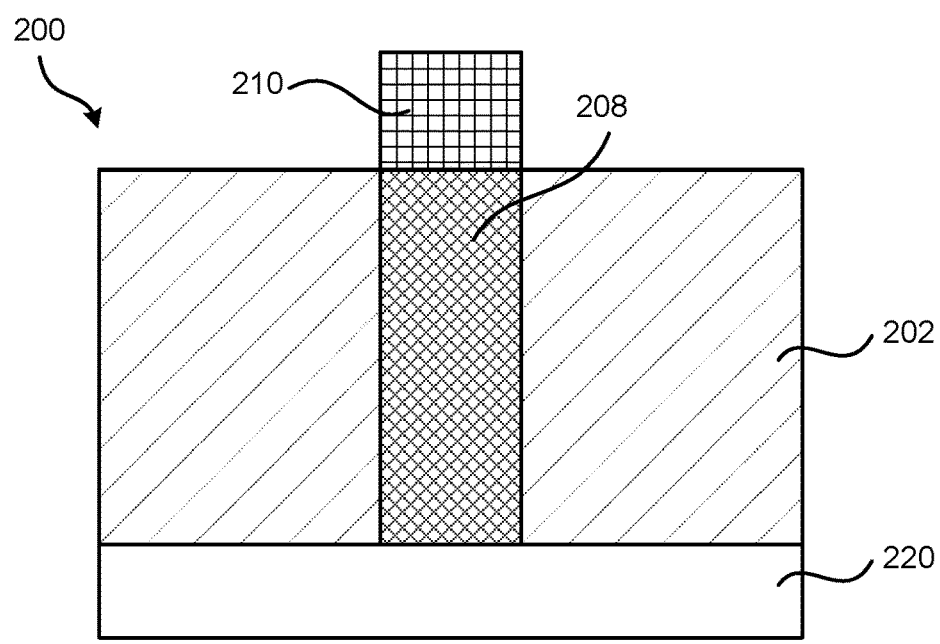

The process flow diagram 1 includes, in 100, providing a planarized substrate 200 containing a first material 202 having a recessed feature filled with a second material 208. The method further includes, in 102, selectively depositing a graphene layer 210 on the second material 208 relative to the first material 202. Methods for depositing graphene are well known in the art and the graphene deposition can be selective on a metal relative to a dielectric material as shown in FIG. 2D. In one example, the graphene layer 210 may be deposited using a carbon-based (e.g., $C_2H_2$) plasma process. Graphene is a form of carbon arranged in a hexagonal lattice, however other types of carbon layers may also be used, for example graphite, diamond, charcoal, carbon nanotubes, and fullerenes.

Figure 2E:
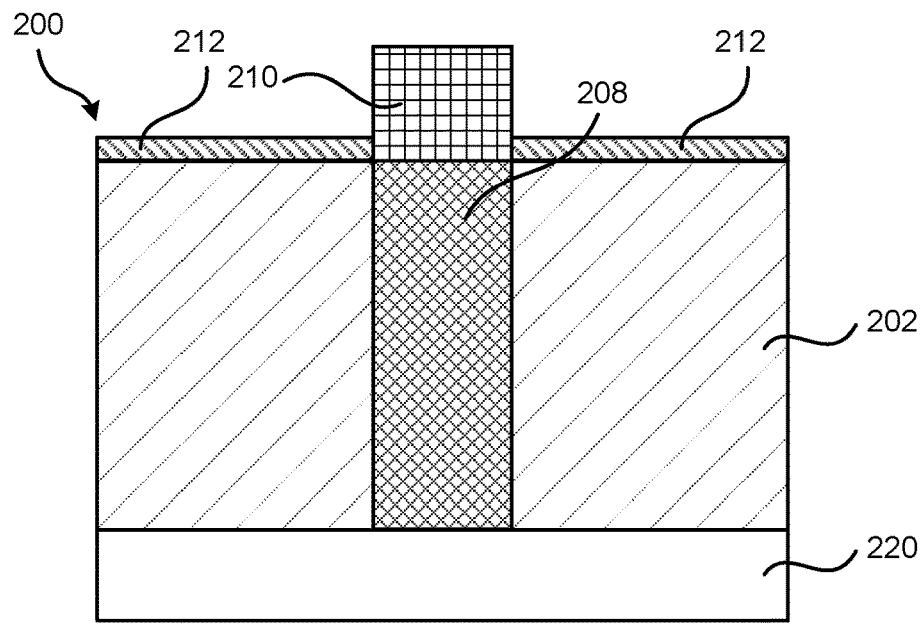

The method further includes, in 104, selectively depositing a $SiO_2$ film 212 on the first material 202 relative to the graphene layer 210. This is schematically shown in FIG. 2E. According to one embodiment, selectively depositing the $SiO_2$ film 210 includes coating the first material 202 with a metal-containing catalyst layer, and in the absence of any oxidizing and hydrolyzing agent, and in the absence of a plasma, exposing the substrate at a substrate temperature of approximately 150° C. or less, to a process gas containing a silanol gas.

According to one embodiment, coating the first material 202 with a metal-containing catalyst layer may proceed by exposing the substrate 200 to a gas pulse containing a metal to selectively adsorb a metal-containing catalyst layer on first material 202 relative to the second material 208. The metal may react to form a chemisorbed layer that is less than a monolayer thick. In one example, the metal-containing catalyst layer may include a metal-containing precursor, e.g., $AlMe_3$. Each gas pulse may include a respective purge or evacuation step to remove unreacted gas or byproducts from the process chamber. The low reactivity of the graphene layer 210 is a result of the difficulty of nucleation on the graphene layer 210. This allows the coating of the first material 202 with the metal-containing catalyst layer to be selective, and the silanol gas then selectively reacts with the metal-containing catalyst layer on the first material 202 but not with the graphene layer 210.

In accordance with some embodiments of the invention, the metal-containing catalyst layer may comprise metal-containing layer. Examples of metal-containing layers include layers that contain aluminum (Al), titanium (Ti), or both aluminum and titanium. According to one embodiment, the metal-containing layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

Embodiments of the invention may utilize a wide variety of Al-containing precursors. For example, many aluminum precursors have the formula: $AlL_1L_2L_3D_x$ where $L_1, L_2, L_3$ are individual anionic ligands, and D is a neutral donor ligand where x can be 0, 1, or 2. Each $L_1, L_2, L_3$ ligand may be individually selected from the groups of alkoxides, halides, aryloxides, amides, cyclopentadienyls, alkyls, silyls, amidinates, β-diketonates, ketoiminates, silanoates, and carboxylates. D ligands may be selected from groups of ethers, furans, pyridines, pyroles, pyrolidines, amines, crown ethers, glymes, and nitriles.

Other examples of aluminum precursors include: $AlMe_3$, $AlEt_3$, $AlMe_2H$, $[Al(O^sBu)_3]_4$, $Al(CH_3COCHCOCH_3)_3$, $AlCl_3$, $AlBr_3$, $AlI_3$, $Al(O^iPr)_3$, $[Al(NMe_2)_3]_2$, $Al(^iBu)_2Cl$, $Al(^iBu)_3$, $Al(^iBu)_2H$, $AlEt_2Cl$, $Et_3Al_2(O^sBu)_3$, and $Al(THD)_3$.

Embodiments of the invention may utilize a wide variety of Ti-containing precursors. Examples include Ti-containing precursors having "Ti—N" intra-molecular bonds include $Ti(NEt_2)_4$ (TDEAT), $Ti(NMeEt)_4$ (TEMAT), $Ti(NMe_2)_4$ (TDMAT). Other examples include Ti-containing precursors containing "Ti—C" intra-molecular bonds include $Ti(COCH_3)(\eta5-C_5H_5)_2Cl$, $Ti(\eta5-C_5H_5)Cl_2$, $Ti(\eta5-C_5H_5)Cl_3$, $Ti(\eta5-C_5H_5)_2Cl_2$, $Ti(\eta5-C_5(CH_3)_5)Cl_3$, $Ti(CH_3)(\eta5-C_5H_5)_2Cl$, $Ti(\eta5-C_9H_7)_2Cl_2$, $Ti((\eta5-C_5(CH_3)_5)_2Cl$, $Ti((\eta5-C_5(CH_3)_5)_2Cl_2$, $Ti(\eta5-C_5H_5)_2(\mu-Cl)_2$, $Ti(\eta5-C_5H_5)_2(CO)_2$, $Ti(CH_3)_3(\eta5-C_5H_5)$, $Ti(CH_3)_2(\eta5-C_5H_5)_2$, $Ti(CH_3)_4$, $Ti(\eta5-C_5H_5)(\eta7-C_7H_7)$, $Ti(\eta5-C_5H_5)(\eta8-C_8H_8)$, $Ti(C_5H_5)_2(\eta5-C_5H_5)_2$, $Ti((C_5H_5)_2)_2(\eta-H)_2$, $Ti(\eta5-C_5(CH_3)_5)_2$, $Ti(\eta5-C_5(CH_3)_5)_2(H)_2$, and $Ti(CH_3)_2(\eta5-C_5(CH_3)_5)_2$. $TiCl_4$ is an example of a titanium halide precursor containing a "Ti-halogen" bond.

The thickness of the conformal $SiO_2$ film 212 is controlled by self-limiting adsorption of the silanol gas on the metal-containing catalyst layer. This catalytic effect can be observed until the $SiO_2$ film 212 is about 3-5 nm thick, thereafter the $SiO_2$ deposition stops. In some examples, the silanol gas may be selected from the group consisting of tris(tert-pentoxy) silanol (TPSOL), tris(tert-butoxy) silanol, and bis(tert-butoxy)(isopropoxy) silanol.

In some examples, the process gas may further contain an inert gas such as Argon. In one embodiment, the process gas may consist of a silanol gas and an inert gas. Furthermore, according to one embodiment, the substrate temperature may be approximately 150° C. or less, during the exposing. In another embodiment, the substrate temperature may be approximately 120° C. or less. In yet another embodiment, the substrate temperature may be approximately 100° C. or less.

Figure 2F:
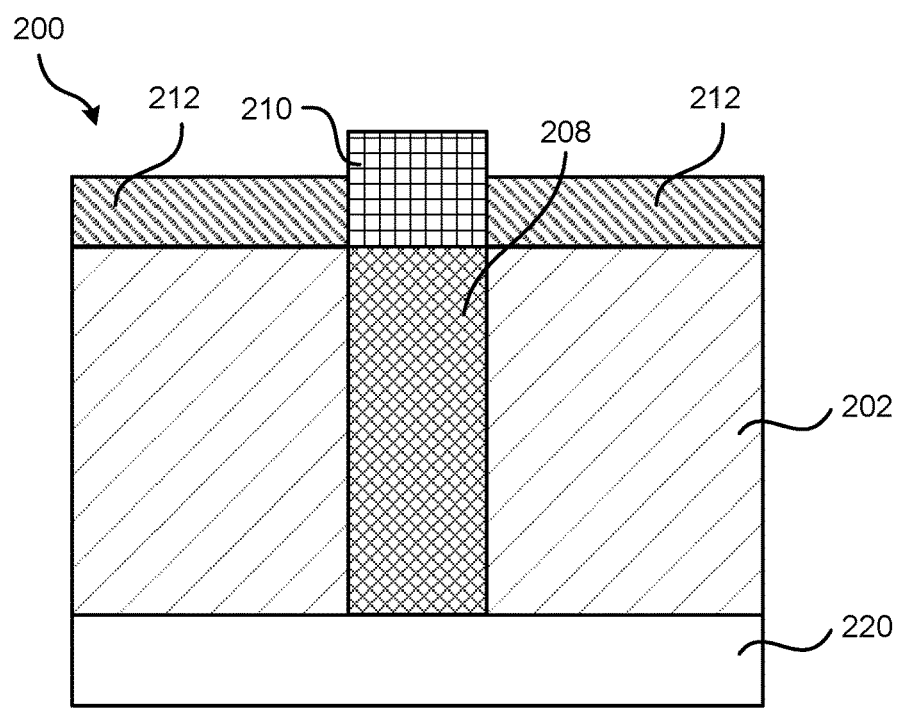

In one embodiment, the method further includes repeating the coating and exposing at least once to increase the thickness of the $SiO_2$ film 212 on the first material 202 by depositing an additional SiO2 film on the $SiO_2$ film 212. This is schematically shown in FIG. 2F where the $SiO_2$ film 212 has an increased thickness.

Figure 2G:
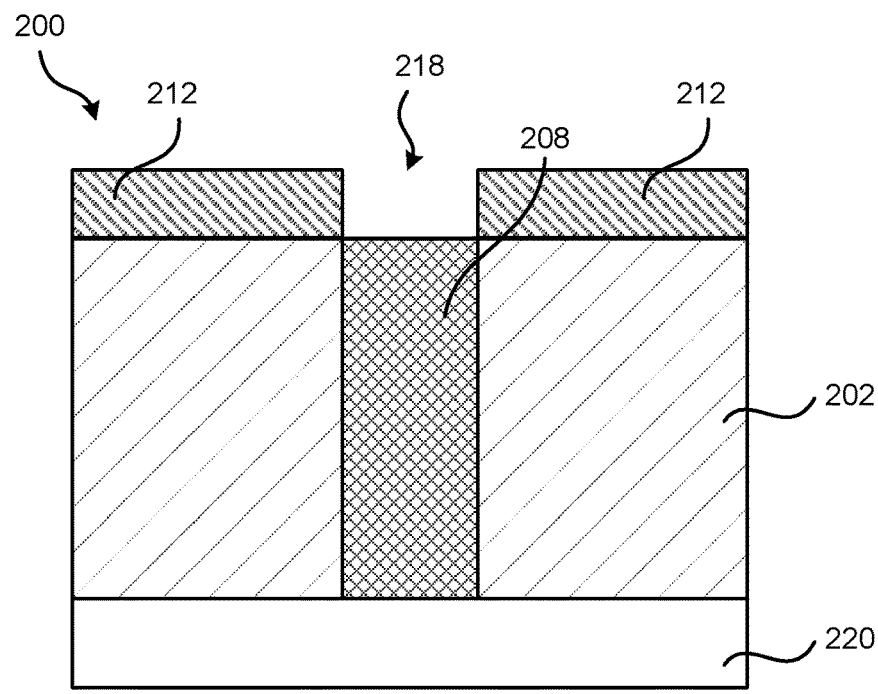
Figure 2H:
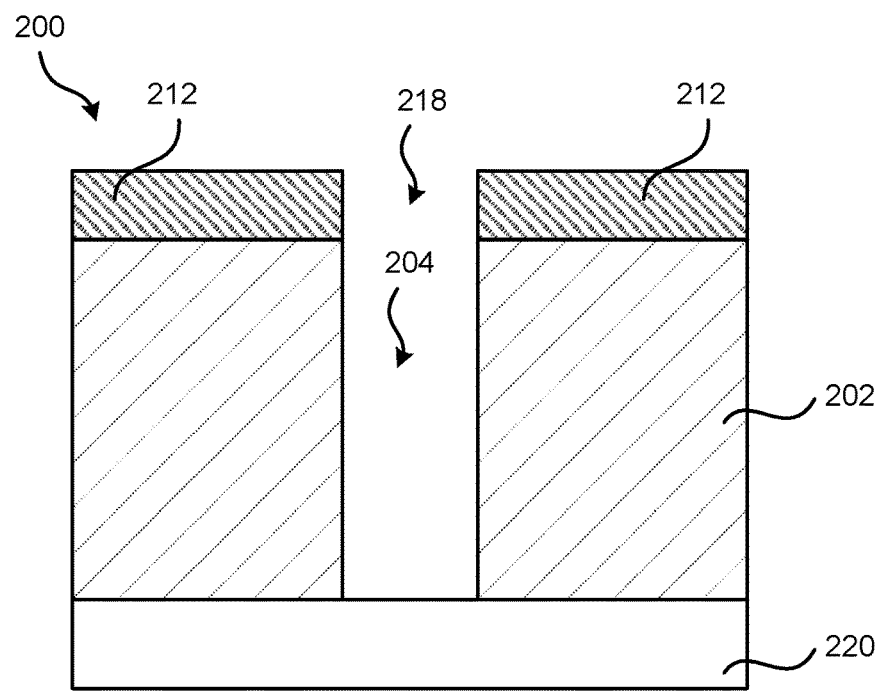

The method further includes, in 106, removing the graphene layer 210 from the substrate 200 and thereby forming a second recessed feature 218 in the selectively deposited $SiO_2$ film 212. This is schematically shown in FIG. 2G. In one example, the graphene layer 210 may be removed using an ashing process that includes an oxygen-containing plasma.

According to one embodiment, the method further includes removing the second material 208 from the recessed feature 204. In the resulting structure, schematically shown in FIG. 2H, a second recessed feature 218 in the $SiO_2$ film 212 is aligned with the recessed feature 204 in the first material 202.

Figure 3A:
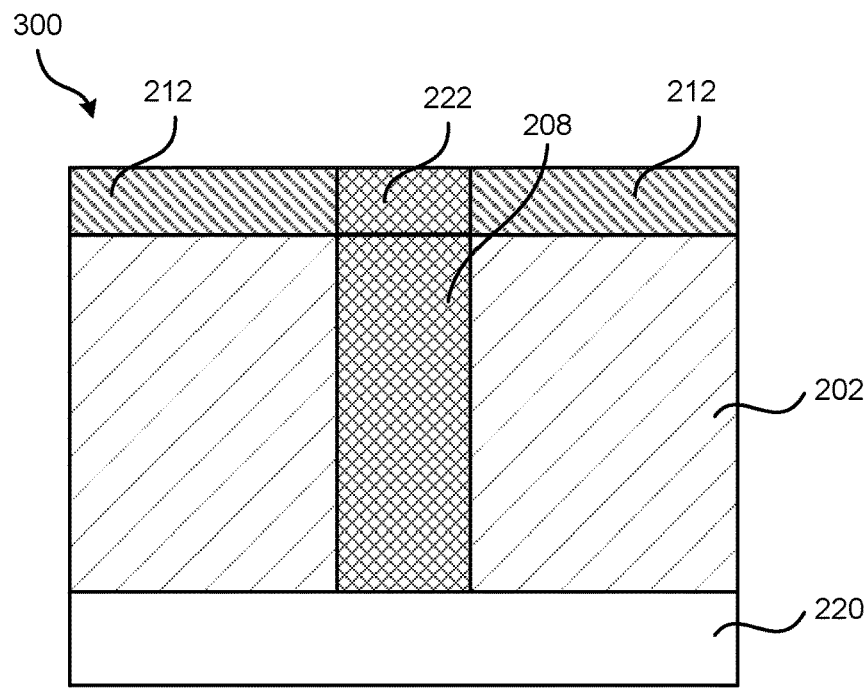
FIGS. 3A-3C schematically shows through cross-sectional view a method of processing a substrate according to an embodiment of the invention.

According to one embodiment, following the removal of the graphene layer 210 from the second material 208 in FIG. 2G, the method can further include filling the second recessed feature 218 in the $SiO_2$ film 212 with a third material 222. This is schematically shown as substrate 300 in FIG. 3A. In one example, the third material 222 can include a metal, for example Ni, Cu, or Ru. In one embodiment, the third material 222 can be the same as the second material 208.

Figure 3B:
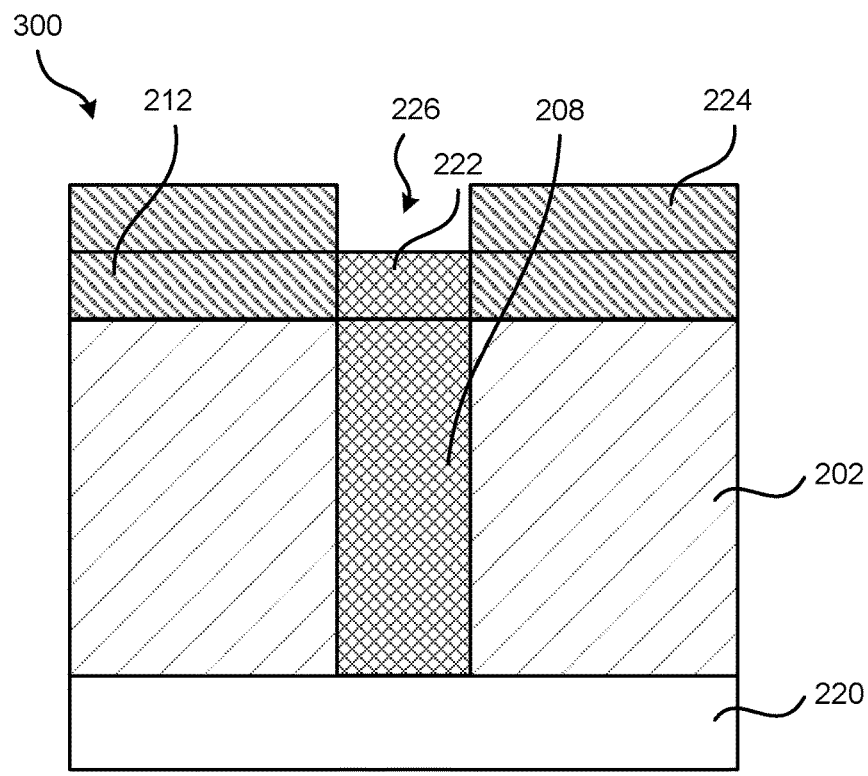

Thereafter, the method can further include repeating the processing steps described in FIGS. 2D-2G. This includes selectively depositing an additional graphene layer on the third material 222 relative to the $SiO_2$ film 212, selectively depositing an additional $SiO_2$ film 224 on the $SiO_2$ film 212 relative to the additional graphene layer, and removing the additional graphene layer from the third material 222 to form a third recessed feature 226 in the additional $SiO_2$ film 224. The resulting structure is schematically shown in FIG. 3B.

Figure 3C:
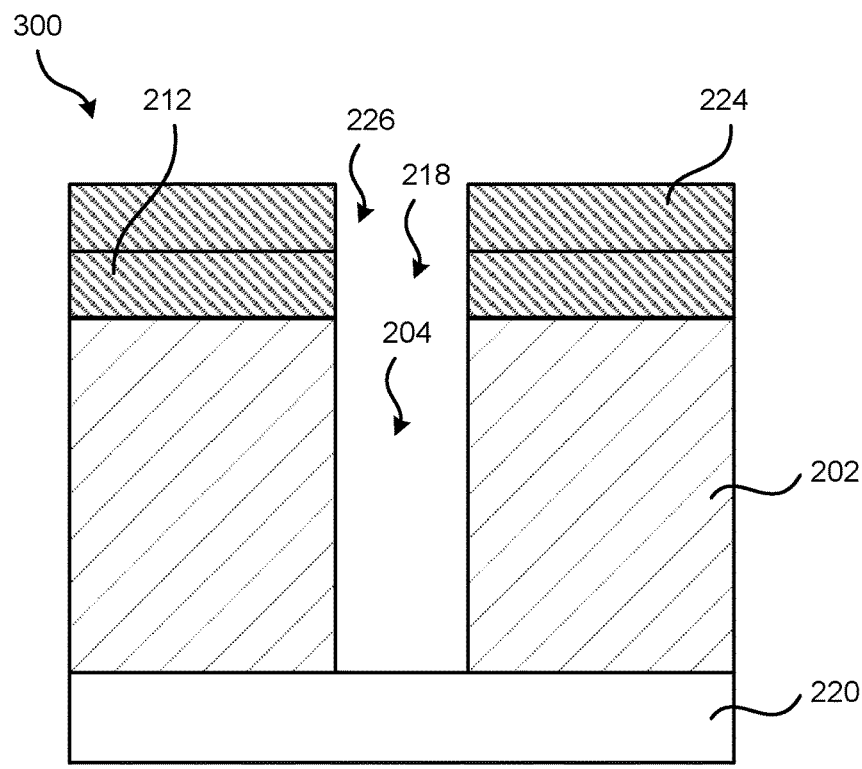

According to one embodiment, the method can further include removing the the third material 222, or both the second material 208 and the third material 222. In the resulting structure, schematically shown in FIG. 3C, the $SiO_2$ film 212 and the additional $SiO_2$ film 224 form a second recessed feature 218 and a third recessed feature 226 that are aligned with the recessed feature 204 in the first material 202.

Figure 4:
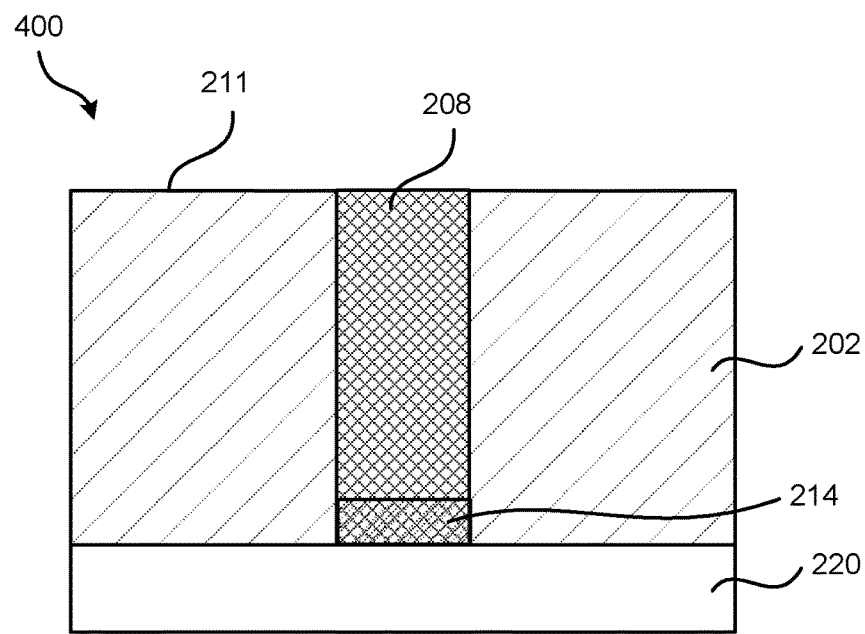
FIG. 4 schematically shows through a cross-sectional view a method of processing a substrate according to an embodiment of the invention.

FIG. 4 schematically shows a cross-sectional view of substrate 400 according to an embodiment of the invention. The substrate 400 is similar to the substrate 200 in FIG. 2A but further includes a metal layer 214 that may be selectively deposited on the base material 220 in the recessed feature 204 prior to the processing described in FIGS. 2B-2H and FIGS. 3A-3C. The metal layer 214 can protect the base material 220 during the deposition and subsequent removal of the second material 208.

Methods for selective vertical growth of dielectric material on a dielectric substrate have been disclosed in various embodiments. The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A substrate processing method, comprising:
   providing a planarized substrate containing a first material having a recessed feature that is filled with a second material;
   selectively depositing a graphene layer on the second material relative to the first material;
   selectively depositing a $SiO_2$ film on the first material relative to the graphene layer; and
   removing the graphene layer from the substrate.

2. The method of claim 1, further comprising
   removing the second material from the recessed feature.

3. The method of claim 1, wherein the selectively depositing a $SiO_2$ film includes
   coating the first material with a metal-containing catalyst layer; and
   in the absence of any oxidizing and hydrolyzing agent, and in the absence of a plasma, exposing the substrate at a substrate temperature of approximately 150° C. or less, to a process gas containing a silanol gas.

4. The method claim 3, further comprising
   repeating the coating and exposing at least once to increase the thickness of the $SiO_2$ film on the first material.

5. The method of claim 3, wherein the metal-containing catalyst layer contains aluminum, titanium, or a combination thereof.

6. The method of claim 3, wherein the metal-containing catalyst layer is selected from the group consisting of Al, $Al_2O_3$, AlN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

7. The method of claim 3, wherein the coating includes exposing the substrate to $AlMe_3$ gas.

8. The method of claim 3, wherein the silanol gas is selected from the group consisting of tris(tert-pentoxy) silanol, tris(tert-butoxy) silanol, and bis(tert-butoxy)(isopropoxy) silanol.

9. The method of claim 1, wherein the first material includes a dielectric material and the second material includes a metal layer.

10. The method of claim 9, wherein the metal layer is selected from the group consisting of Ni, Cu, and Ru.

11. The method of claim 1, wherein the selectively depositing the $SiO_2$ film forms a second recessed feature that is aligned with the recessed feature that is filled with the second material, the method further including
    filling the second recessed feature with a third material.

12. The method of claim 11, wherein the third material includes a metal layer selected from Ni, Cu, and Ru.

13. The method of claim 11, further including
    selectively depositing an additional graphene layer on the third material relative to the $SiO_2$ film;
    selectively depositing an additional $SiO_2$ film on the $SiO_2$ film relative to the additional graphene layer;
    removing the additional graphene layer from the third material.

14. The method of claim 13, further comprising
    removing the third material from the substrate.

15. The method of claim 13, further comprising
    removing the second and third materials from the substrate.

16. The method of claim 13, wherein the selectively depositing the additional $SiO_2$ film includes
    coating the $SiO_2$ film with a metal-containing catalyst layer; and
    in the absence of any oxidizing and hydrolyzing agent, and in the absence of a plasma, exposing the substrate at a substrate temperature of approximately 150° C. or less, to a process gas containing a silanol gas.

17. The method claim 16, further comprising
    repeating the coating and exposing at least once to increase the thickness of the additional $SiO_2$ film on the $SiO_2$ film.

18. The method of claim 16, wherein the metal-containing catalyst layer contains aluminum, titanium, or a combination thereof.

19. The method of claim 16, wherein the metal-containing catalyst layer is selected from the group consisting of Al, $Al_2O_3$, AN, AlON, an Al-containing precursor, Al-alloys, CuAl, TiAlN, TaAlN, Ti, TiAlC, $TiO_2$, TiON, TiN, a Ti-containing precursor, Ti-alloys, and combinations thereof.

20. The method of claim 16, wherein the silanol gas is selected from the group consisting of tris(tert-pentoxy) silanol, tris(tert-butoxy) silanol, and bis(tert-butoxy)(isopropoxy) silanol.

* * * * *